(12) United States Patent
Orita

(10) Patent No.: US 6,746,945 B2
(45) Date of Patent: Jun. 8, 2004

(54) METHOD OF FORMING A VIA HOLE IN A SEMICONDUCTOR DEVICE

(75) Inventor: Toshiyuki Orita, Tokyo (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 0 days.

(21) Appl. No.: 10/329,794

(22) Filed: Dec. 27, 2002

(65) Prior Publication Data

US 2003/0109123 A1 Jun. 12, 2003

Related U.S. Application Data

(63) Continuation of application No. 09/489,890, filed on Jan. 24, 2000, now Pat. No. 6,537,902.

(51) Int. Cl.$^7$ .............................. H01L 21/44
(52) U.S. Cl. .............. 438/597; 438/634; 438/637; 438/639; 438/642; 438/648; 438/704; 438/723; 438/724; 438/725; 438/696; 438/675; 438/685; 257/640; 257/645; 257/642
(58) Field of Search ................. 438/597, 634, 438/638, 644, 648, 723, 724, 725, 740, 743, 744, 696, 637, 675, 685; 257/640, 641, 642

(56) References Cited

U.S. PATENT DOCUMENTS

| 5,707,901 A | * | 1/1998 | Cho et al. ............... 438/595 |
| 5,756,396 A | * | 5/1998 | Lee et al. ............... 438/622 |
| 5,827,778 A | * | 10/1998 | Yamada ............... 438/637 |
| 5,982,035 A | * | 11/1999 | Tran et al. ............... 257/750 |
| RE36,518 E | * | 1/2000 | Dennison et al. ............ 438/586 |
| 6,080,660 A | * | 6/2000 | Wang et al. ............ 438/637 |
| 6,097,094 A | * | 8/2000 | Ishigami ............... 257/763 |
| 6,232,218 B1 | * | 5/2001 | Cathey et al. ............. 428/634 |
| 6,350,672 B1 | * | 2/2002 | Sun ............ 438/619 |

FOREIGN PATENT DOCUMENTS

| JP | 4-8335 | * | 1/1996 | |
| JP | 8-8335 | | 1/1996 | |
| WO | WO-9916118 | * | 4/1999 | ......... H01L/21/314 |

* cited by examiner

Primary Examiner—Matthew Smith
Assistant Examiner—Belur V Keshavan
(74) Attorney, Agent, or Firm—Rabin & Berdo, P.C.

(57) ABSTRACT

A material layer which contains nitrogen atoms is formed on a first wiring or at a side surface of a first wiring. When etching for forming a via hole is carried out, nitrogen atoms contained in the material layer bind with CF molecules, $CF_2$ molecules, $CF_3$ molecules and the like contained in an etching gas, and compounds thus formed adhere to a surface of a silicon dioxide layer at side walls and a bottom portion of a via hole. As a result, once the material layer is exposed during etching for forming a via hole, thereafter, the etching rate decreases. Accordingly, even if there is misalignment of a via hole pattern with respect to a first wiring pattern when the via hole pattern is formed by lithography, etching of the silicon dioxide layer does not proceed to an underlying silicon substrate. Thus, short circuits are not formed between the first wiring and the silicon substrate via a second wiring layer which is deposited later.

12 Claims, 8 Drawing Sheets

METHOD OF FORMING A VIA HOLE IN A SEMICONDUCTOR DEVICE

This application is a continuation of U.S. application Ser. No. 09/489,890, filed Jan. 24, 2000, now U.S. Pat. No. 6,537,902.

BACKGROUND OF THE INVENTION

1. Field of the Invention

The present invention relates to a method of forming a via hole during the process of manufacturing a semiconductor device.

2. Description of the Related Art

In the conventional art, via holes are formed in semiconductor devices by the method illustrated in FIGS. 1A through 1G. Namely, the sequence of processes in forming a via hole in the conventional art is as follows.

(1) As shown in FIG. 1A, a first $SiO_2$ layer 2 is formed on a Si substrate 1.
(2) As shown in FIG. 1B, a first Al layer 3 is deposited by a sputtering method.
(3) As shown in FIG. 1C, a resist pattern 4 for forming a wiring pattern is formed on the first Al layer 3 by lithography.
(4) As shown in FIG. 1D, a first Al wiring 33 is formed by plasma etching.
(5) As shown in FIG. 1E, a second $SiO_2$ layer 5 is formed as an interlayer dielectric layer.
(6) As shown in FIG. 1F, a resist pattern 6 for forming a via hole pattern is formed by lithography.
(7) As shown in FIG. 1G, a via hole 7 is formed by plasma etching.

However, in the conventional via hole forming methods, in cases in which the via hole is misaligned with respect to the wiring pattern when the via hole pattern is formed by lithography, not only is the second $SiO_2$ layer 5 (which is to be removed by etching), but also the first $SiO_2$ layer 2 is etched (see FIG. 1G). If the etching reaches the Si substrate 1 as shown in FIG. 2A, a short circuit will be formed between the first Al wiring 3 and the Si substrate 1 via a second Al layer 8 which is deposited thereafter. As a result, the problem that the semiconductor device will not function properly will arise.

SUMMARY OF THE INVENTION

In view of the aforementioned, an object of the present invention is to overcome the above-described drawbacks of the prior art. Namely, the present invention provides a method of forming a via hole in a semiconductor substrate in which, even if a via hole pattern is misaligned with respect to a wiring pattern during the time the via hole pattern is being formed by lithography, etching of the $SiO_2$ layer will not proceed to the underlying Si substrate, and accordingly, no short circuit will be formed between the first wiring and the Si substrate via a second wiring layer which is deposited thereafter.

In order to achieve this object, a first aspect of the present invention is a method of manufacturing a semiconductor device comprising the steps of: forming a wiring pattern on a primary surface of a semiconductor substrate, the wiring pattern being formed by layering a conductive layer and a TiN layer; forming an oxide layer to cover the primary surface of the semiconductor substrate and the wiring pattern formed thereon; and exposing a portion of the upper portion surface of the wiring pattern by photolithography and etching, and forming an opening in a portion of the oxide layer, the opening extending from one portion of the upper portion surface of the wiring pattern and being within a predetermined distance from a side wall end of the wiring pattern.

In a second aspect of the present invention, in the first aspect, the compositional ratio by mole of nitrogen in the TiN layer is 1 or more.

A third aspect of the present invention is a method of manufacturing a semiconductor device comprising the steps of: forming a wiring pattern on a primary surface of a semiconductor substrate, the wiring pattern being formed by layering a conductive layer and a layer of material containing nitrogen; forming an oxide layer to cover the primary surface of the semiconductor substrate and the wiring pattern formed thereon; and exposing the upper portion surface of the conductive layer at a portion of the wiring pattern by photolithography and etching, and forming an opening in a portion of the oxide layer, the opening extending from one portion of the upper portion surface of the wiring pattern and being within a predetermined distance from a side wall end of the wiring pattern.

A fourth aspect of the present invention is a method of manufacturing a semiconductor device comprising the steps of: forming a wiring pattern on a primary surface of a semiconductor substrate by using a conductive layer; forming a spacer, which is formed by a layer of material containing nitrogen, on side walls of the wiring pattern; forming an oxide layer to cover the primary surface of the semiconductor substrate and the wiring pattern and spacer formed thereon; and exposing a portion of the upper portion surface of the wiring pattern by photolithography and etching, and forming an opening in a portion of the oxide layer, the opening extending from one portion of the upper portion surface of the wiring pattern and being within a predetermined distance from a side wall end of the wiring pattern.

A fifth aspect of the present invention is a method of manufacturing a semiconductor device comprising the steps of: forming a wiring pattern on a primary surface of a semiconductor substrate by using a conductive layer; forming a layer of material containing nitrogen to cover the primary surface of the semiconductor substrate and the wiring pattern formed thereon; forming an oxide layer on a layer of material containing nitrogen; and exposing a portion of the upper portion surface of the wiring pattern by photolithography and etching, and forming an opening in a portion of the oxide layer, the opening extending from one portion of the upper portion surface of the wiring pattern and being within a predetermined distance from a side wall end of the wiring pattern.

A sixth aspect of the present invention is a method of manufacturing a semiconductor device comprising the steps of: forming a layer of material containing nitrogen on a primary surface of a semiconductor substrate; forming a wiring pattern on the nitrogen layer by using a conductive layer; forming an oxide layer to cover a layer of material containing nitrogen and the wiring pattern formed thereon; and exposing a portion of the upper portion surface of the wiring pattern by photolithography and etching, and forming an opening in a portion of the oxide layer, the opening extending from one portion of the upper portion surface of the wiring pattern and being within a predetermined distance from a side wall end of the wiring pattern.

A seventh aspect of the present invention is a method of manufacturing a semiconductor device comprising the steps of: forming a wiring pattern on a primary surface of a semiconductor substrate by using a conductive layer; forming an organic silicon dioxide layer by rotatingly applying an organic silicon containing solution onto the primary surface of the semiconductor substrate and the wiring pattern formed thereon; forming an oxide layer on the organic silicon dioxide layer; and exposing a portion of the upper portion surface of the wiring pattern by photolithography and etching, and forming an opening in a portion of the oxide layer, the opening extending from one portion of the upper portion surface of the wiring pattern and being within a predetermined distance from a side wall end of the wiring pattern.

In an eighth aspect of the present invention, in the first aspect, in a case in which a planar pattern of the opening is a substantially circular pattern having a diameter of at least 0.3 µm, the predetermined distance being no more than 0.15 µm.

In a ninth aspect of the present invention, in the first aspect, in a case in which a planar pattern of the opening is a substantially circular pattern having a diameter of less than 0.3 µm, the predetermined distance being no more than one-half of the diameter of the opening.

A tenth aspect of the present invention is a method of manufacturing a semiconductor device comprising the steps of: (a) forming a wiring pattern on a primary surface of a semiconductor substrate; (b) forming an etch resistant layer on the primary surface of the semiconductor substrate; (c) forming an electrically insulative layer covering the wiring layer; and (d) forming a via hole through the insulative layer to the wiring pattern, and if not to the wiring pattern, then to the etch resistant layer.

In an eleventh aspect of the present invention, in the tenth aspect, the etch resistant layer includes TiN.

In a twelfth aspect of the present invention, in the eleventh aspect, the compositional ratio by mole of N in the TiN, is at least 1.

In a thirteenth aspect of the present invention, in the eleventh aspect, the compositional ratio by mole of N in the TiN, is at least 1.2.

In a fourteenth aspect of the present invention, in the tenth aspect, the etch resistant layer includes SiN.

In a fifteenth aspect of the present invention, in the tenth aspect, the etch resistant layer is formed from an organic spin on glass material.

In a sixteenth aspect of the present invention, in the tenth aspect, the etch resistant layer is formed over the wiring pattern.

In a seventeenth aspect of the present invention, in the tenth aspect, the step of forming a via hole exposes a portion of the etch resistant layer, and further including the step of removing at least a part of the exposed portion of the etch resistant layer.

In an eighteenth aspect of the present invention, the method of the tenth aspect further includes the step of removing a portion of the etch resistant layer, prior to forming an electrically insulative layer covering the wiring layer.

In a nineteenth aspect of the present invention, in the method of the eighteenth aspect, the wiring pattern covers portions of the silicon substrate and the step of removing a portion of the etch resistant layer, includes removing the portion of the etch resistant layer sufficient to expose the wiring pattern therebeneath, with the remainder of the etch resistant layer substantially covering the silicon substrate.

In a twentieth aspect of the present invention, in the tenth aspect, the etch resistant layer is formed over the silicon substrate, and the wiring pattern is formed over the etch resistant layer.

DESCRIPTION OF THE PREFERRED EMBODIMENTS

First Embodiment

A first embodiment of the present invention is illustrated in FIGS. 3A through 3G. The present first embodiment differs from conventional methods with regard to a TiN layer formed on the first Al wiring 3. The compositional ratio of the N in the TiN by mole formed on the first Al wiring is 1 or more. (This TiN is a so-called cap TiN which is usually used as a reflection preventing layer and a hillock preventing layer.)

As can be seen from FIGS. 3A through 3G, the sequence of processes for forming the via hole in the first embodiment is as follows.

Figure 1A:
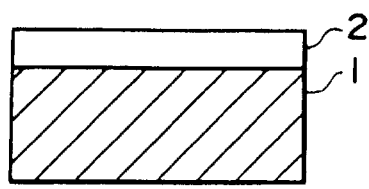
FIGS. 1A through 1G are diagrams illustrating the sequence of processes of a conventional method of forming a via hole in a semiconductor device.
Figure 1E:
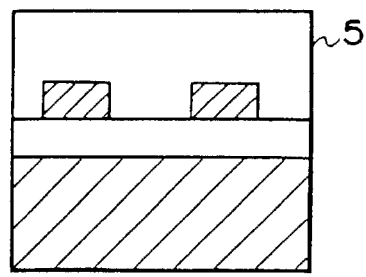
Figure 1B:
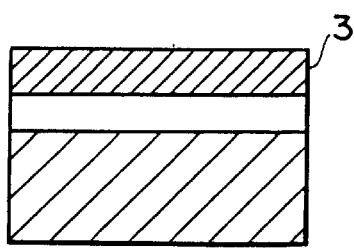
Figure 1F:
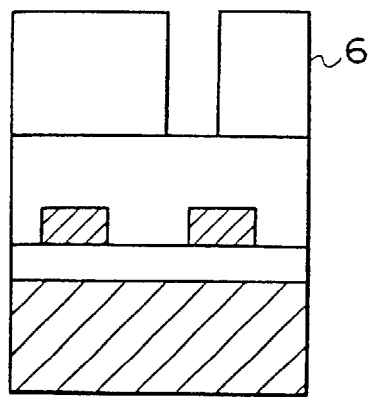
Figure 1C:
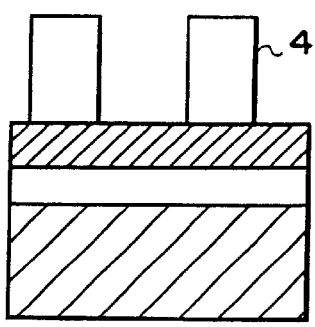
Figure 1D:
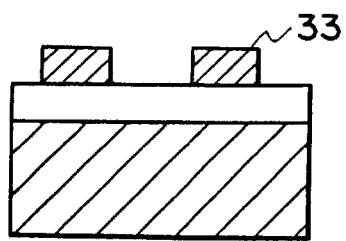
Figure 1G:
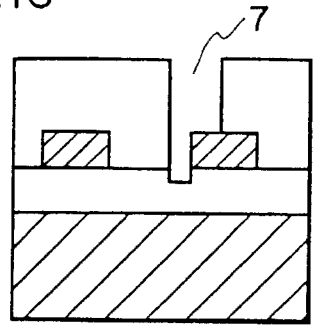
Figure 2A:
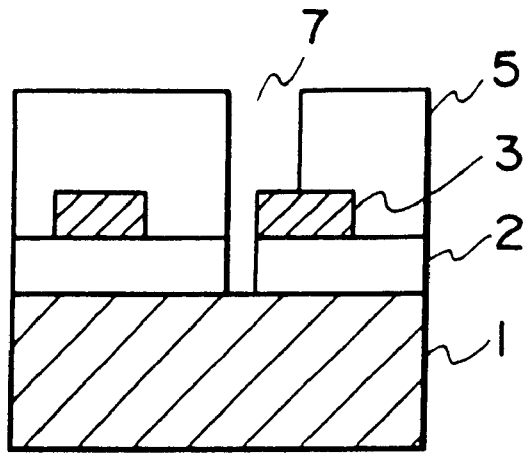
FIGS. 2A and 2B are diagrams for explaining problems with the conventional method of forming a via hole in a semiconductor device.
Figure 2B:
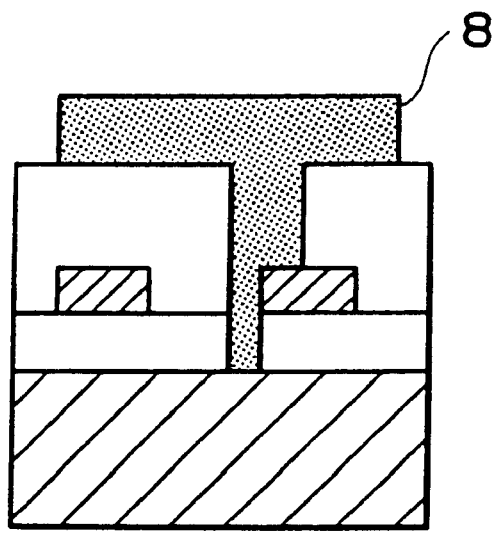
Figure 3A:
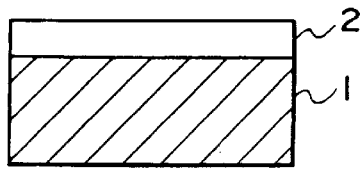
FIGS. 3A through 3G are diagrams illustrating the sequence of processes of a method, according to a first embodiment of the present invention, of forming a via hole in a semiconductor device.

(1) As shown in FIG. 3A, the first $SiO_2$ layer 2 is formed on the Si substrate 1.

Figure 3E:
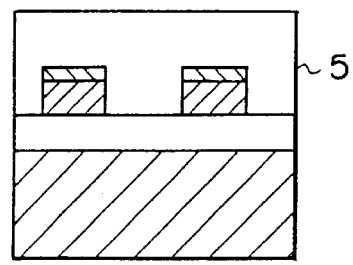
Figure 3B:
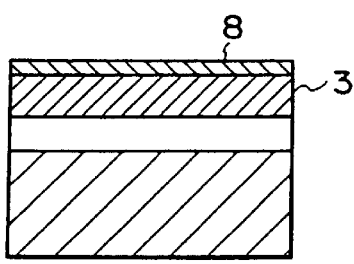

(2) As shown in FIG. 3B, the first Al layer 3 is deposited by a sputtering method. Thereafter, TiN is deposited by CVD (chemical vapor deposition). At this time, the compositional ratio of the N in the TiN by mole is 1.2.

Figure 3F:
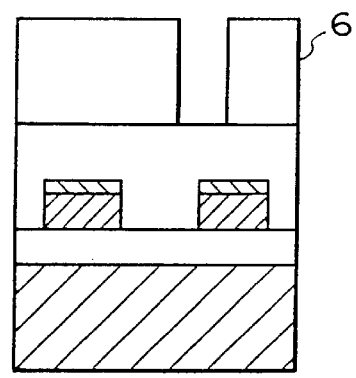
Figure 3C:
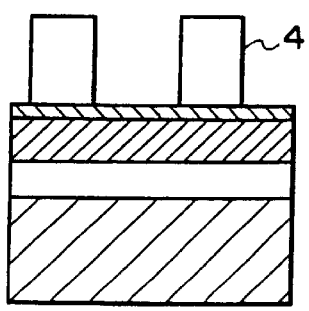

(3) As shown in FIG. 3C, a resist pattern 4 for forming a wiring pattern is formed by lithography.

Figure 3G:
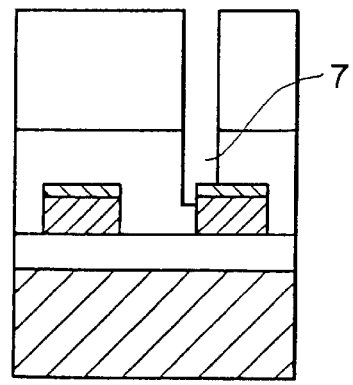
Figure 3D:
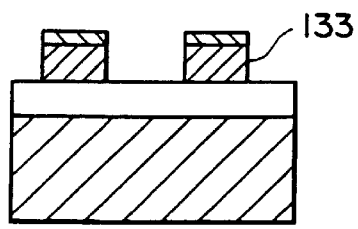

(4) As shown in FIG. 3D, a first Al wiring 133 is formed by plasma etching.

(5) As shown in FIG. 3E, the second $SiO_2$ layer 5 is formed as an interlayer dielectric layer.

(6) As shown in FIG. 3F, the resist pattern 6 for forming a via hole pattern is formed by lithography.

(7) As shown in FIG. 3G, a via hole 7 having a diameter of 0.3 µm is formed by plasma etching. The conditions for plasma etching in this step are as follows. The etching apparatus is an ME-RIE (magnetron enhanced reactive ion etching) type apparatus.

Etching Conditions
  pressure: 40 mTorr
  rf-power: 1500 W
  magnitude of magnetic field: 120 Gauss
  $C_4F_8$ flow rate: 20 sccm
  CO flow rate: 250 sccm
  Ar flow rate: 500 sccm Under the above-described etching conditions, the selectivity of $SiO_2$ to TiN during the etching process is about 30, in a case in which the compositional ratio of the N in the TiN by mole is 1.2.

In accordance with the present first embodiment, a cap-TiN having a compositional ratio of N of 1.0 or more is formed on the first Al wiring. As a result, if the maximum distance from an end portion of the first Al wiring to a side wall of the via hole is 0.15 μm or less due to misalignment of the via hole with respect to the first Al wiring during formation of the via hole by lithography, once the TiN on the first aluminum wiring is exposed in the etching process for forming the via hole, the etching rate of the $SiO_2$ layer thereafter will be substantially 0 Å/min. Accordingly, even if the via hole pattern is misaligned with respect to the wiring pattern when the via hole pattern is being formed by lithography, the etching of the $SiO_2$ layer does not proceed to the underlying Si substrate. As a result, the problem of short circuits being formed between the first wiring and the Si substrate via a second wiring layer that is deposited later does not occur.

The reason that the etching rate of the $SiO_2$ in the via hole becomes substantially 0 Å/min after the TiN is exposed during the etching process for forming a via hole is as follows. At first, the $C_4F_8$ in the etching gas decomposes such that CF molecules, $CF_2$ molecules and $CF_3$ molecules are generated. Simultaneously, nitrogen atoms are released from the layer that contains N (in the first embodiment, the TiN layer). As a result, these molecules and the nitrogen atoms bind together so as to form compounds. These compounds adhere to the $SiO_2$ layer at the side walls and bottom portion of the via hole. The compounds adhering to the $SiO_2$ layer result in a lowering of the etching rate of the $SiO_2$ layer.

In other words, the etching rate is dependent on the aforementioned "maximum distance from an end portion of the first Al wiring to a side wall of the via hole", and on the state of the top surface of the first Al wiring layer exposed by the etching for forming the via hole. Accordingly, if the diameter of the via hole is at least 0.3 μm, it is preferable that the "maximum distance from an end portion of the first Al wiring to a side wall of the via hole" (referred to as "maximum distance" hereinafter) is less than or equal to 0.15 μm. If the diameter of the via hole is less than 0.3 μm, it is preferable that the "maximum distance" is less than or equal to one-half of the diameter of the via hole.

The reason why the "maximum distance" is set in the above manner is as follows. If the diameter of the via hole is 0.3 μm or less, little surface area of the top surface of the first Al wiring layer is exposed. Therefore, there is less releasing of nitrogen atoms which cause the etching rate of the $SiO_2$ layer to decrease. As a result, the etching rate of the $SiO_2$ layer increases, and the same problems as in the conventional art arise. Therefore, by making the "maximum distance" smaller and the region which is to be etched smaller, the amount of etching is reduced, which prevents the above-described problems from occurring.

Second Embodiment

A second embodiment of the present invention is illustrated in FIGS. 4A through 4H. The present second embodiment differs from conventional methods with regard to the point that a SiN (silicon nitride layer) is formed on the first aluminum wiring.

As can be seen from FIGS. 4A through 4H, the sequence of processes for forming the via hole in the second embodiment is as follows.

Figure 4A:
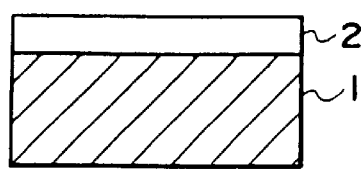
FIGS. 4A through 4H are diagrams illustrating the sequence of processes of a method, according to a second embodiment of the present invention, of forming a via hole in a semiconductor device.
Figure 4B:
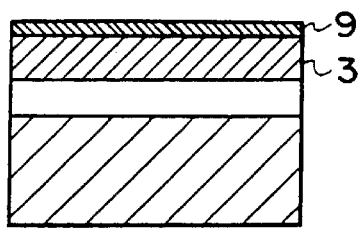
Figure 4C:
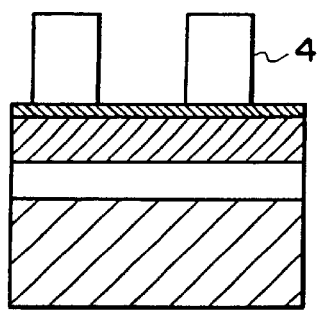
Figure 4D:
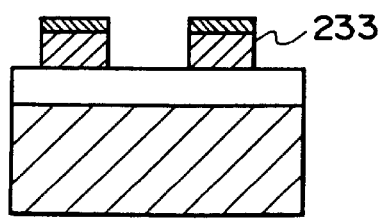
Figure 4E:
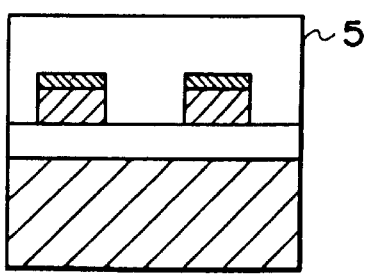
Figure 4F:
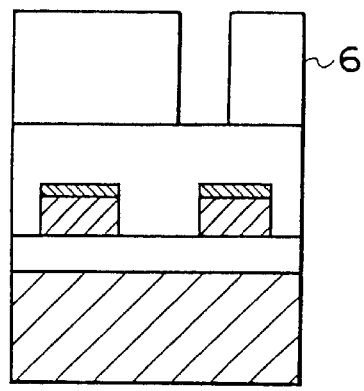
Figure 4G:
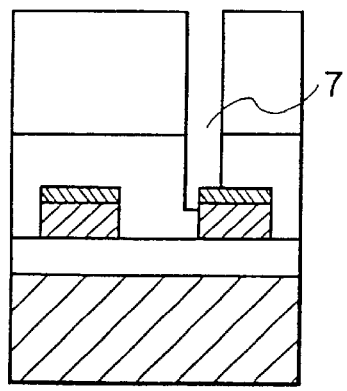
Figure 4H:
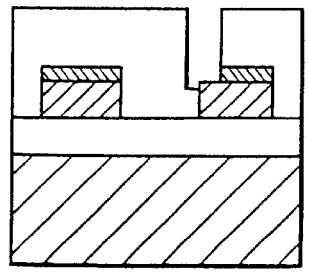

(1) As shown in FIG. 4A, the first $SiO_2$ layer 2 is formed on the Si substrate 1.
(2) As shown in FIG. 4B, the first Al layer 3 is deposited by a sputtering method. Thereafter, SiN 9 is deposited by CVD (chemical vapor deposition).
(3) As shown in FIG. 4C, the resist pattern 4 for forming a wiring pattern is formed by lithography.
(4) As shown in FIG. 4D, a first Al wiring 233 is formed by plasma etching.
(5) As shown in FIG. 4E, the second $SiO_2$ layer 5 is formed as an interlayer dielectric layer.
(6) As shown in FIG. 4F, the resist pattern 6 for forming a via hole pattern is formed by lithography.
(7) As shown in FIG. 4G, the via hole 7 having a diameter of 0.3 μm is formed by plasma etching.
(8) As shown in FIG. 4H, the SiN 9 at the bottom portion of the via hole is removed by plasma etching.

The type of the etching apparatus for forming the via hole and the etching conditions are the same as in the first embodiment. Namely, the etching apparatus is a ME-RIE type apparatus, and the etching conditions are as follows.

Etching Conditions
  pressure: 40 mTorr
  rf-power: 1500 W
  magnitude of magnetic field: 120 Gauss
  $C_4F_8$ flow rate: 20 sccm
  CO flow rate: 250 sccm
  Ar flow rate: 500 sccm Under the above-described etching conditions, the selectivity of $SiO_2$ to SiN during the etching process is about 30.

In accordance with the present second embodiment, an SiN layer is formed on the first Al wiring. As a result, if the maximum distance from an end portion of the first Al wiring to a side wall of the via hole is 0.15 μm or less due to misalignment of the via hole with respect to the first Al wiring during formation of the via hole by lithography, once the SiN layer on the first aluminum wiring is exposed in the etching process for forming the via hole, the etching rate of the $SiO_2$ layer thereafter will be substantially 0 Å/min. Accordingly, even if the via hole pattern is misaligned with respect to the wiring pattern when the via hole pattern is being formed by lithography, the etching of the $SiO_2$ layer does not proceed to the underlying Si substrate. As a result, the problem of short circuits being formed between the first wiring and the Si substrate via a second wiring layer that is deposited later does not occur.

The reason that the etching rate of the $SiO_2$ in the via hole becomes substantially 0 Å/min after the SiN layer is exposed during the etching process for forming a via hole is the same as in the first embodiment. Namely, compounds formed by the etching gas and the nitrogen atoms released from the SiN layer adhere to the surface of the silicon dioxide layer at the side walls and the bottom portion of the via hole.

Third Embodiment

A third embodiment of the present invention is illustrated in FIGS. 5A through 5I. The present third embodiment differs from conventional methods with regard to the point that, after the first Al wiring layer is formed, a spacer, which is formed by an SiN sidewall (hereinafter SiN—SW), is formed.

As can be seen from FIGS. 5A through 5I, the sequence of processes for forming the via hole in the third embodiment is as follows.

Figure 5A:
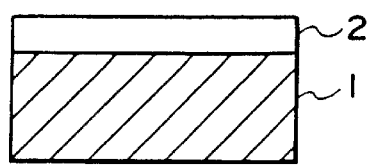
FIGS. 5A through 5I are diagrams illustrating the sequence of processes of a method, according to a third embodiment of the present invention, of forming a via hole in a semiconductor device.
Figure 5B:
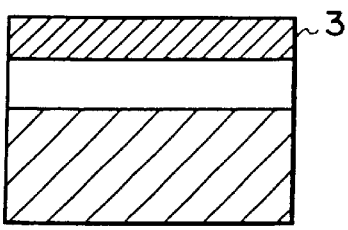
Figure 5C:
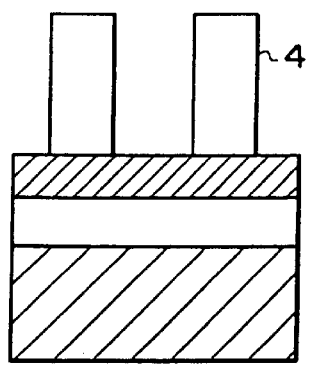
Figure 5D:
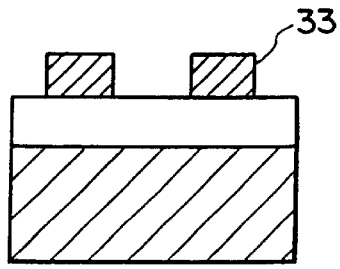
Figure 5E:
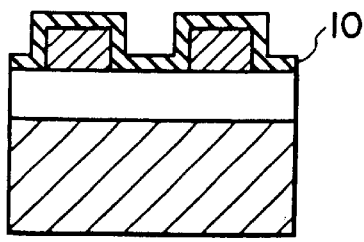
Figure 5F:
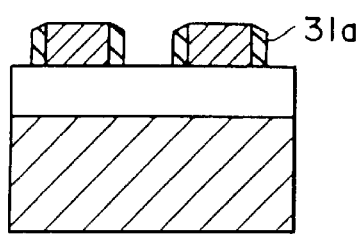
Figure 5G:
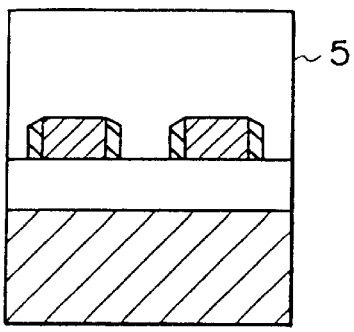
Figure 5H:
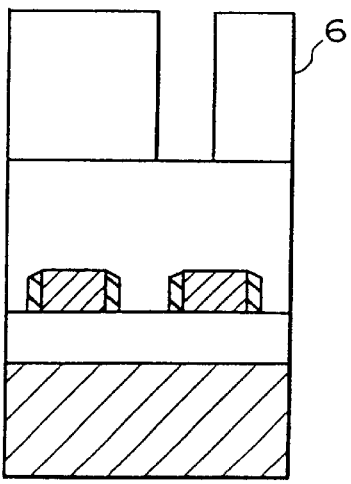
Figure 5I:
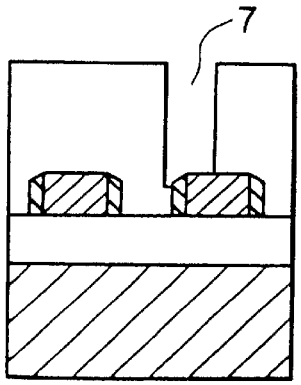

(1) As shown in FIG. 5A, the first $SiO_2$ layer 2 is formed on the Si substrate 1.
(2) As shown in FIG. 5B, the first Al layer 3 is deposited by a sputtering method.
(3) As shown in FIG. 5C, a resist pattern 4 for forming a wiring pattern is formed by lithography.
(4) As shown in FIG. 5D, the first Al wiring 33 is formed by plasma etching.
(5) As shown in FIG. 5E, SiN 10 is deposited by CVD.
(6) As shown in FIG. 5F, the SiN 10 is etched back by plasma etching to so as to form a SiN—SW 31a.
(7) As shown in FIG. 5G, the second $SiO_2$ layer 5 is formed as an interlayer dielectric layer.
(8) As shown in FIG. 5H, the resist pattern 6 for forming a via hole pattern is formed by lithography.
(9) As shown in FIG. 5I, the via hole 7 having a diameter of 0.3 μm is formed by plasma etching.

The type of the etching apparatus for forming the via hole and the etching conditions are the same as those in the first and second embodiments.

In accordance with the present third embodiment, an SiN sidewall is formed after the first Al wiring is formed. As a result, if the maximum distance from an end portion of the first Al wiring to a side wall of the via hole is 0.15 μm or less due to misalignment of the via hole with respect to the first Al wiring during formation of the via hole by lithography, once the SiN—SW on the first aluminum wiring is exposed in the etching process for forming the via hole, the etching rate of the $SiO_2$ layer thereafter will be substantially 0 Å/min. Accordingly, even if the via hole pattern is misaligned with respect to the wiring pattern when the via hole pattern is being formed by lithography, the etching of the $SiO_2$ layer does not proceed to the underlying Si substrate. As a result, the problem of short circuits being formed between the first wiring and the Si substrate via a second wiring layer that is deposited later does not occur.

The reason that the etching rate of the $SiO_2$ in the via hole becomes substantially 0 Å/min after the SiN—SW layer is exposed during the etching process for forming a via hole is the same as in the first embodiment. Namely, compounds formed by the etching gas and the nitrogen atoms released from the SiN—SW layer adhere to the surface of the silicon dioxide layer at the side walls and the bottom portion of the via hole.

Fourth Embodiment

A fourth embodiment of the present invention is illustrated in FIGS. 6A through 6I. The present fourth embodiment differs from conventional methods with regard to the point that an SiN layer is formed after the first Al wiring is formed. Further, the present fourth embodiment differs from the third embodiment with regard to the point that the formed SiN layer is not etched.

As can be seen from FIGS. 6A through 6I, the sequence of processes for forming the via hole in the fourth embodiment is as follows.

Figure 6A:
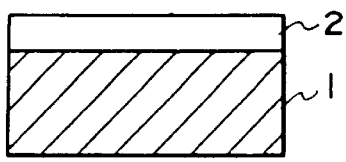
FIGS. 6A through 6I are diagrams illustrating the sequence of processes of a method, according to a fourth embodiment of the present invention, of forming a via hole in a semiconductor device.
Figure 6B:
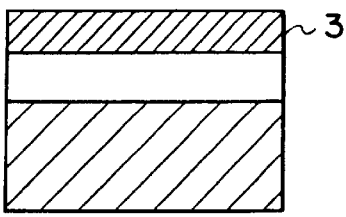
Figure 6C:
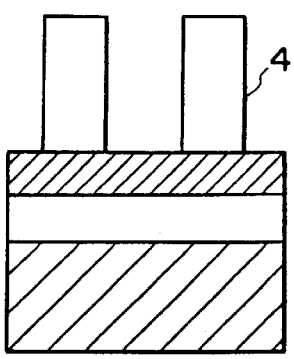
Figure 6D:
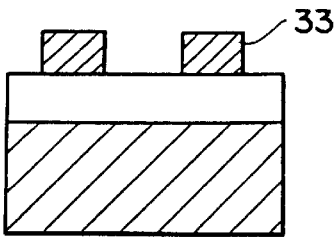
Figure 6E:
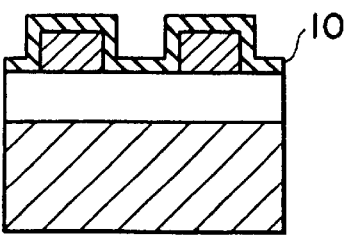
Figure 6F:
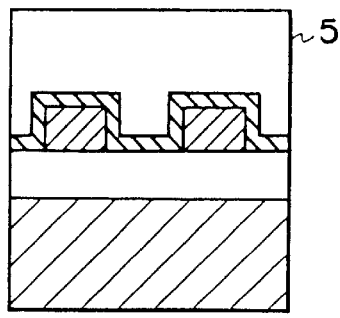
Figure 6G:
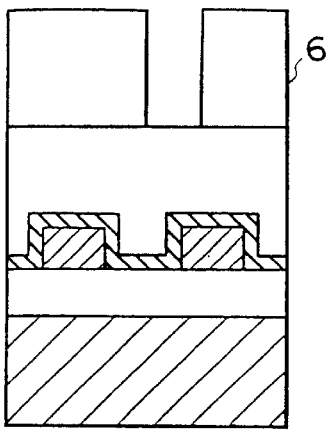
Figure 6H:
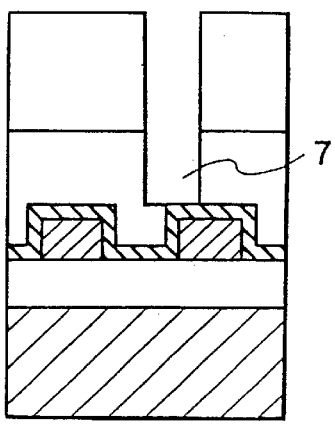
Figure 6I:
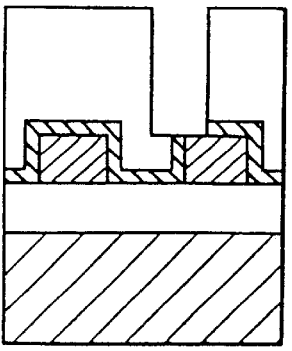

(1) As shown in FIG. 6A, the first $SiO_2$ layer 2 is formed on the Si substrate 1.
(2) As shown in FIG. 6B, the first Al layer 3 is deposited by a sputtering method.
(3) As shown in FIG. 6C, the resist pattern 4 for forming a wiring pattern is formed by lithography.
(4) As shown in FIG. 6D, the first Al wiring 33 is formed by plasma etching.
(5) As shown in FIG. 6E, the SiN 10 is deposited by CVD.
(6) As shown in FIG. 6F, the second $SiO_2$ layer 5 is formed as an interlayer dielectric layer.
(7) As shown in FIG. 6G, the resist pattern 6 for forming a via hole pattern is formed by lithography.
(8) As shown in FIG. 6H, the via hole 7 having a diameter of 0.3 μm is formed by plasma etching.
(9) As shown in FIG. 6I, the SiN layer 10 is removed from the bottom portion of the via hole by plasma etching.

The type of the etching apparatus for forming the via hole and the etching conditions are the same as those in the first through third embodiments. Further, the etching in step (9) may be carried out by the same etching apparatus as used in step (8). By varying the etching conditions, etching can be carried out under the condition that the etching rates of the $SiO_2$ and the SiN are substantially the same.

In accordance with the present fourth embodiment, the SiN layer is formed after the first Al wiring is formed. As a result, if the maximum distance from an end portion of the first Al wiring to a side wall of the via hole is 0.15 μm or less due to misalignment of the via hole with respect to the first Al wiring during formation of the via hole by lithography, once the SiN on the first aluminum wiring is exposed in the etching process for forming the via hole, the etching rate of the $SiO_2$ layer thereafter will be substantially 0 Å/min. Accordingly, even if the via hole pattern is misaligned with respect to the wiring pattern when the via hole pattern is being formed by lithography, the etching of the $SiO_2$ layer does not proceed to the underlying Si substrate. As a result, the problem of short circuits being formed between the first wiring and the Si substrate via a second wiring layer that is deposited later does not occur.

The reason that the etching rate of the $SiO_2$ in the via hole becomes substantially 0 Å/min after the SiN layer is exposed during the etching process for forming a via hole is the same as in the first through third embodiments.

Further, the etching process, which is necessary in the third embodiment, can be eliminated, thereby resulting in a reduction in the manufacturing cost of the semiconductor device.

Fifth Embodiment

A fifth embodiment of the present invention is illustrated in FIGS. 7A through 7H. The present fifth embodiment differs from conventional methods with regard to the point that a SiN layer is formed before the first Al wiring is formed. As a result, in the etching process for forming the via hole, the etching stops at the point in time when the etching proceeds to the surface of the SiN layer and the SiN layer is exposed.

As can be seen from FIGS. 7A through 7H, the sequence of processes for forming the via hole in the fifth embodiment is as follows.

Figure 7A:
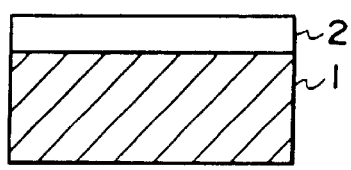
FIGS. 7A through 7H are diagrams illustrating the sequence of processes of a method, according to a fifth embodiment of the present invention, of forming a via hole in a semiconductor device.
Figure 7B:
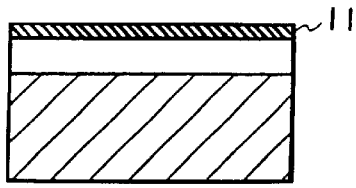
Figure 7C:
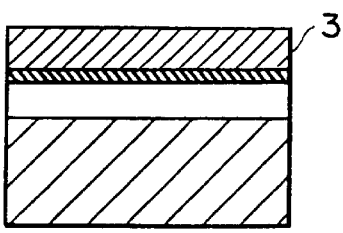
Figure 7D:
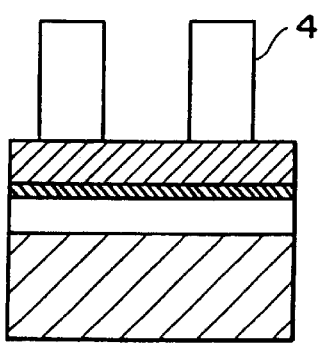
Figure 7E:
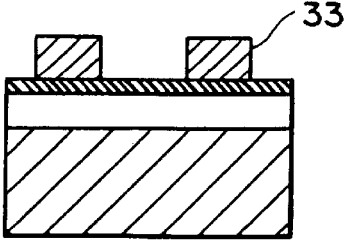
Figure 7F:
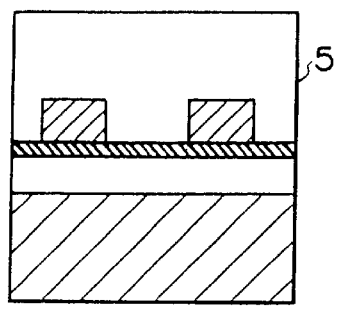
Figure 7G:
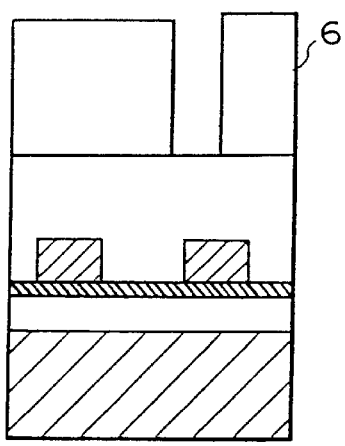
Figure 7H:
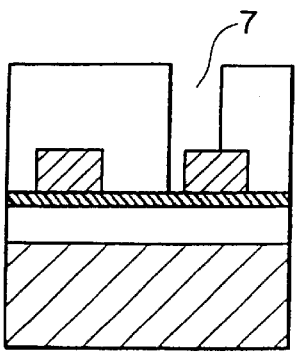

(1) As shown in FIG. 7A, the first $SiO_2$ layer 2 is formed on the Si substrate 1.
(2) As shown in FIG. 7B, an SiN 11 layer is deposited by CVD.
(3) As shown in FIG. 7C, the first Al layer 3 is deposited by a sputtering method.
(4) As shown in FIG. 7D, the resist pattern 4 for forming a wiring pattern is formed by lithography.
(5) As shown in FIG. 7E, the first Al wiring 33 is formed by plasma etching.
(6) As shown in FIG. 7F, the second $SiO_2$ layer 5 is formed as an interlayer dielectric layer.
(7) As shown in FIG. 7G, the resist pattern 6 for forming a via hole pattern is formed by lithography.
(8) As shown in FIG. 7H, the via hole 7 is formed by plasma etching.

The type of the etching apparatus for forming the via hole and the etching conditions are the same as those in the first through fourth embodiments.

In accordance with the present fifth embodiment, the SiN layer is formed before the first Al wiring is formed. As a result, even if the via hole pattern is misaligned with respect to the wiring pattern when the via hole pattern is being formed by lithography, the etching of the $SiO_2$ layer does not proceed to the underlying Si substrate. Accordingly, the problem of short circuits being formed between the first wiring and the Si substrate via a second wiring layer that is deposited later does not occur.

The reason that the progress of the etching for forming the via hole stops at the SiN layer 11 is that, as described in the second embodiment, via hole etching is carried out under the condition that the etching selectivity of $SiO_2$ with respect to SiN is high.

Sixth Embodiment

A sixth embodiment of the present invention is illustrated in FIGS. 8A through 8H. The present sixth embodiment differs from conventional methods with regard to the point that an organic SOG (spin on glass) layer is formed after the first Al wiring is formed. As a result, in the etching process for forming the via hole, the etching proceeds to the surface of the organic SOG layer, and then stops at the point in time when the organic SOG layer is exposed.

As can be seen from FIGS. 8A through 8H, the sequence of processes for forming the via hole in the sixth embodiment is as follows.

Figure 8A:
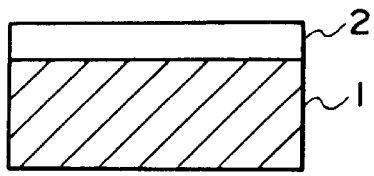
FIGS. 8A through 8H are diagrams illustrating the sequence of processes of a method, according to a sixth embodiment of the present invention, of forming a via hole in a semiconductor device.
Figure 8B:
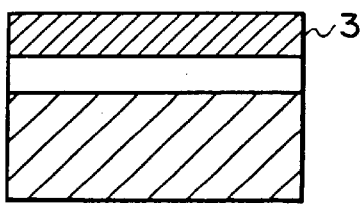
Figure 8C:
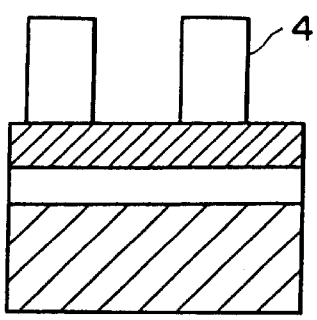
Figure 8D:
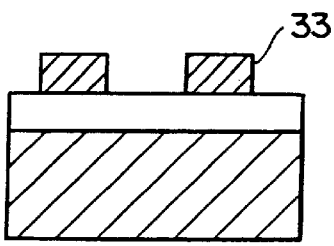
Figure 8E:
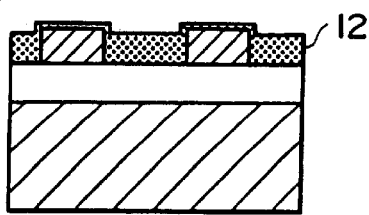
Figure 8F:
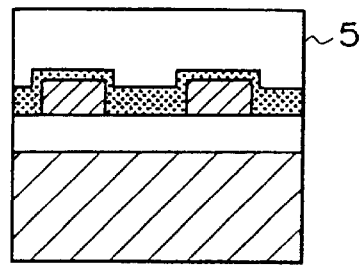
Figure 8G:
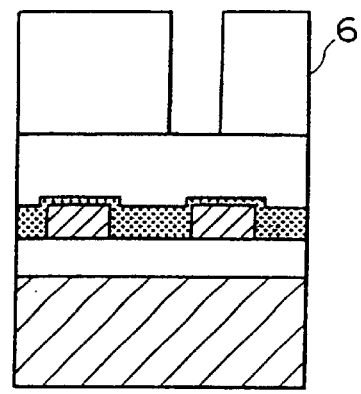
Figure 8H:
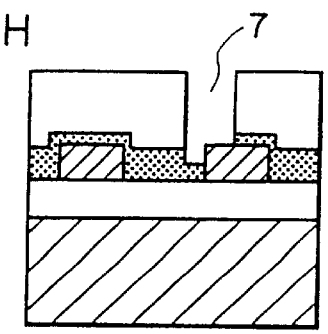

(1) As shown in FIG. 8A, the first $SiO_2$ layer 2 is formed on the Si substrate 1.
(2) As shown in FIG. 8B, the first Al layer 3 is deposited by a sputtering method.
(3) As shown in FIG. 8C, the resist pattern 4 for forming a wiring pattern is formed by lithography.
(4) As shown in FIG. 8D, the first Al wiring 33 is formed by plasma etching.
(5) As shown in FIG. 8E, the structure on the primary surface of the substrate is coated by an organic SOG layer 12.
(6) As shown in FIG. 8F, the second $SiO_2$ layer 5 is formed as an interlayer dielectric layer.
(7) As shown in FIG. 8G, the resist pattern 6 for forming a via hole pattern is formed by lithography.
(8) As shown in FIG. 8H, the via hole 7 is formed by plasma etching.

The type of the etching apparatus for forming the via hole and the etching conditions are the same as those in the first through fifth embodiments. Under these etching conditions, the selectivity of $SiO_2$ to the organic SOG during the etching process is about 5.

In accordance with the present sixth embodiment, the organic SOG layer is formed after the first Al wiring is formed. As a result, even if the via hole pattern is misaligned with respect to the wiring pattern when the via hole pattern is being formed by lithography, the etching of the $SiO_2$ layer does not proceed to the underlying Si substrate. Accordingly, the problem of short circuits being formed between the first wiring and the Si substrate via a second wiring layer that is deposited later does not occur.

The reason that the progress of the etching for forming the via hole stops at the organic SOG layer 12 is that, because the organic SOG layer 12 contains carbon atoms, it is difficult to etch the organic SOG layer 12.

All of the above embodiments are described in relation to a process for forming a via hole. Further, the underlying wiring is the first Al wiring. However, the present invention is not limited to the same. The present invention may also be applied to other types of contact hole forming techniques for obtaining an electrical connection to a conductive underlying wiring.

What is claimed is:

1. A method of manufacturing a semiconductor device comprising the steps of:

forming a wiring pattern on a primary surface of a semiconductor substrate, the wiring pattern being formed by layering a conductive layer and a TiN layer only on areas of the primary surface comprising the wiring pattern;

forming an oxide layer to cover the primary surface of the semiconductor substrate and the wiring pattern formed thereon; and exposing a portion of the upper portion surface of the wiring pattern by photolithography and etching, and forming an opening in a portion of the oxide layer, the opening extending from one portion of the upper portion surface of the wiring pattern and a sidewall of the opening being within a maximum distance of no more than 0.15 $\mu$m from an end portion of the wiring pattern.

2. A method of manufacturing a semiconductor device according to claim 1, wherein the compositional ratio by mole of nitrogen in the TiN layer is 1 or more.

3. A method of manufacturing a semiconductor device according to claim 1, wherein a planar pattern of the opening is a substantially circular pattern having a diameter of at least 0.3 $\mu$m.

4. A method of manufacturing a semiconductor device according to claim 1, wherein in a case in which a planar pattern of the opening is a substantially circular pattern having a diameter of less than 0.3 $\mu$m, the maximum distance from an end portion of the wiring pattern to a sidewall of the opening is no more one-half of the diameter of the opening.

5. A method of manufacturing a semiconductor device comprising the steps of:

forming a wiring pattern on a primary surface of a semiconductor substrate, the wiring pattern being formed by layering a conductive layer and a layer of material containing nitrogen only on areas of the primary surface comprising the wiring pattern;

forming an oxide layer to cover the primary surface of the semiconductor substrate and the wiring pattern formed thereon; and exposing the upper portion surface of the conductive layer at a portion of the wiring pattern by photolithography and etching, and forming an opening in a portion of the oxide layer, the opening extending from one portion of the upper portion surface of the wiring pattern and a sidewall of the opening being within a maximum distance of no more than 0.15 $\mu$m from an end portion of the wiring pattern.

6. A method of manufacturing a semiconductor device according to claim 5, wherein in a case in which a planar pattern of the opening is a substantially circular pattern having a diameter of less than 0.3 $\mu$m, the maximum distance from an end portion of the wiring pattern to a sidewall of the opening is no more than one-half of the diameter of the opening.

7. A method of manufacturing a semiconductor device comprising the steps of:

(a) forming a wiring pattern on a primary surface of a semiconductor substrate;

(b) forming an etch resistant layer on the primary surface of the semiconductor substrate;

(c) forming an electrically insulative layer covering the wiring layer; and (d) forming a via hole through the insulative layer to the wiring pattern, and if not to the wiring pattern, then to the etch resistant layer;

wherein the etch resistant layer includes TiN, and wherein the via hole is formed having no sidewall more than 0.15 µm from an end portion of the wiring pattern.

8. The method of claim 7, wherein the compositional ratio by mole of N in the TiN, is at least 1.

9. The method of claim 7, wherein the compositional ratio by mole of N in the TiN, is at least 1.2.

10. A method of manufacturing a semiconductor device according to claim 7, wherein in a case in which a planar pattern of the opening is a substantially circular pattern having a diameter of less than 0.3 µm, the maximum distance from an end portion of the wiring pattern to a sidewall of the opening is no more than one-half of the diameter of the opening.

11. A method of manufacturing a semiconductor device comprising the steps of:

(a) forming a wiring pattern on a primary surface of a semiconductor substrate;

(b) forming an etch resistant layer on the primary surface of the semiconductor substrate;

(c) forming an electrically insulative layer covering the wiring layer; and (d) forming a via hole through the insulative layer to the wiring pattern, and if not to the wiring pattern, then to the etch resistant layer;

wherein the etch resistant layer is formed only on the wiring pattern, and wherein the via hole is formed having no sidewall more than 0.15 µm from an end portion of the wiring pattern.

12. A method of manufacturing a semiconductor device according to claim 11, wherein in a case in which a planar pattern of the opening is a substantially circular pattern having a diameter of less than 0.3 µm, the maximum distance from an end portion of the wiring pattern to a sidewall of the opening is no more than one-half of the diameter of the opening.

* * * * *